(12) United States Patent
Briggs et al.

(10) Patent No.: US 10,256,191 B2
(45) Date of Patent: Apr. 9, 2019

(54) HYBRID DIELECTRIC SCHEME FOR VARYING LINER THICKNESS AND MANGANESE CONCENTRATION

(71) Applicant: International Business Machines Corporation, Armonk, NY (US)

(72) Inventors: Benjamin D. Briggs, Waterford, NY (US); Lawrence A. Clevenger, LaGrangeville, NY (US); Nicholas A. Lanzillo, Troy, NY (US); Takeshi Nogami, Schenectady, NY (US); Christopher J. Penny, Saratoga Springs, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/412,768

(22) Filed: Jan. 23, 2017

(65) Prior Publication Data
US 2018/0211920 A1   Jul. 26, 2018

(51) Int. Cl.
*H01L 23/52* (2006.01)
*H01L 23/532* (2006.01)
*H01L 23/522* (2006.01)
*H01L 21/768* (2006.01)

(52) U.S. Cl.
CPC .. *H01L 23/53238* (2013.01); *H01L 21/76847* (2013.01); *H01L 23/5226* (2013.01)

(58) Field of Classification Search
CPC ........... H01L 23/5226; H01L 23/53238; H01L 21/76847
See application file for complete search history.

(56) References Cited

U.S. PATENT DOCUMENTS

| | | |
|---|---|---|
| 7,057,287 B2 | 6/2006 | Kumar et al. |
| 7,737,561 B2 | 6/2010 | Kumar et al. |
| 7,960,245 B2 | 6/2011 | Bernstein et al. |
| 8,133,805 B2 | 3/2012 | Dimitrakopoulos et al. |
| 8,481,422 B2 | 7/2013 | Chan et al. |

(Continued)

OTHER PUBLICATIONS

List of IBM Patents or Patent Applications Treated as Related; (Appendix P), Filed Sep. 14, 2018; 2 pages.

(Continued)

*Primary Examiner* — Cuong Q Nguyen
(74) *Attorney, Agent, or Firm* — Cantor Colburn LLP; Vazken Alexanian

(57) ABSTRACT

A semiconductor device is provided and includes first and second dielectrics, first and second conductive elements, a self-formed-barrier (SFB) and a liner. The first and second dielectrics are disposed with one of first-over-second dielectric layering and second-over-first dielectric layering. The first and second conductive elements are respectively suspended at least partially within a lower one of the first and second dielectrics and at least partially within the other one of the first and second dielectrics. The self-formed-barrier (SFB) is formed about a portion of one of the first and second conductive elements which is suspended in the second dielectric. The liner is deposited about a portion of the other one of the first and second conductive elements which is partially suspended in the first dielectric.

5 Claims, 3 Drawing Sheets

(56) References Cited

U.S. PATENT DOCUMENTS

| | | |
|---|---|---|
| 8,673,779 B1 | 3/2014 | Yoon et al. |
| 8,828,870 B2 | 9/2014 | Cabral, Jr. |
| 9,362,228 B2 | 6/2016 | Chae et al. |
| 9,379,057 B2 | 6/2016 | Huang et al. |
| 9,502,288 B2 | 11/2016 | Nguyen et al. |
| 2004/0094839 A1 | 5/2004 | Fitzsimmons et al. |
| 2006/0006449 A1 | 1/2006 | Jeong et al. |
| 2009/0072400 A1* | 3/2009 | Zhu ............... H01L 21/76847 257/751 |
| 2010/0200991 A1 | 8/2010 | Akolkar et al. |
| 2011/0006429 A1 | 1/2011 | Liu et al. |
| 2011/0183515 A1* | 7/2011 | Kudo ............... H01L 23/53238 438/653 |
| 2014/0021614 A1 | 1/2014 | Yu et al. |
| 2016/0064321 A1 | 3/2016 | Huang et al. |
| 2016/0307796 A1 | 10/2016 | Yoo et al. |

OTHER PUBLICATIONS

Benjamin D. Briggs et al., "Hybrid Dielectric Scheme for Varying Liner Thickness and Manganese Concentration", U.S. Appl. No. 16/131,553, filed Sep. 14, 2018.

* cited by examiner

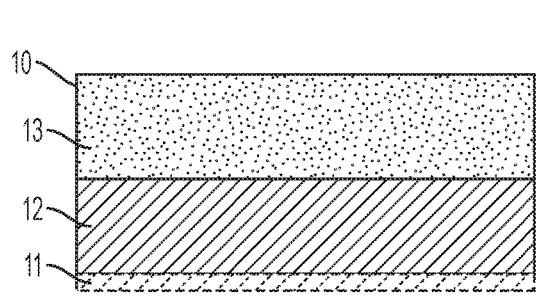
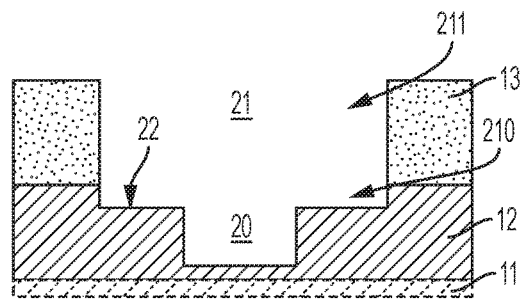
FIG. 1  FIG. 2
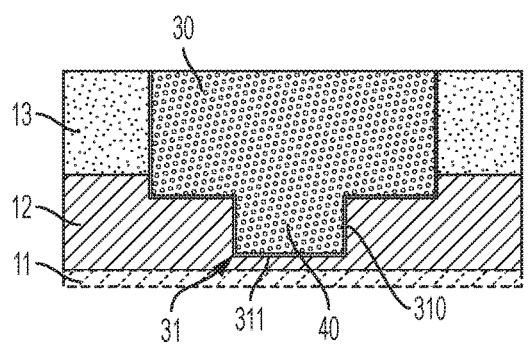
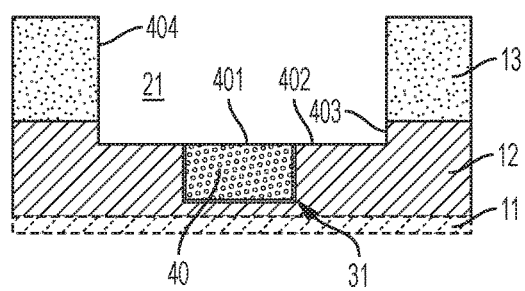
FIG. 3  FIG. 4
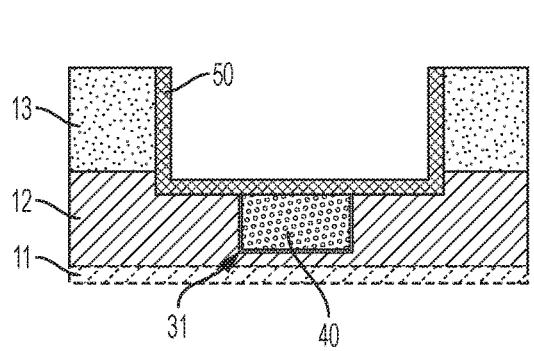
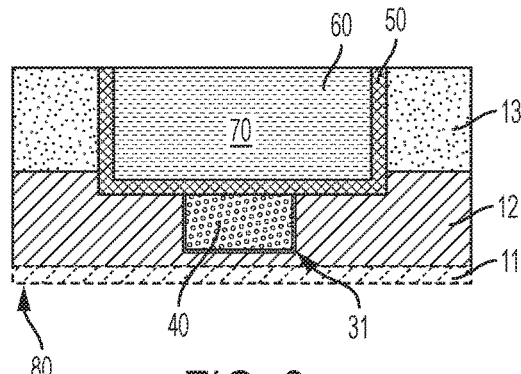
FIG. 5  FIG. 6

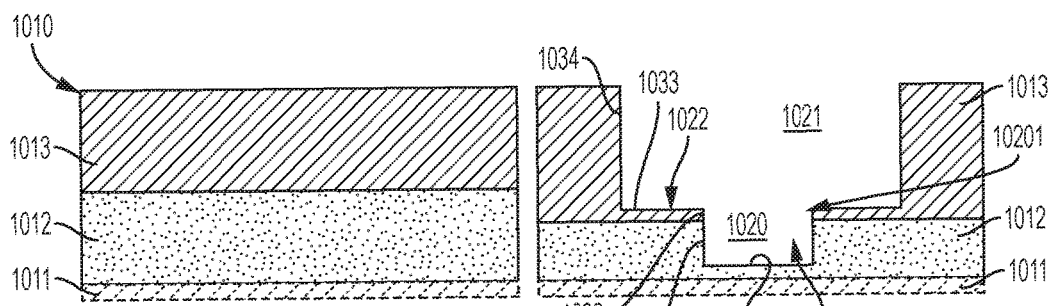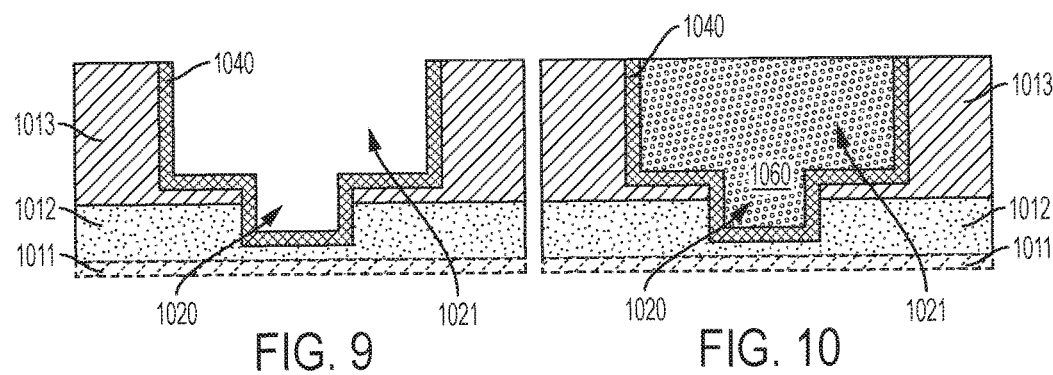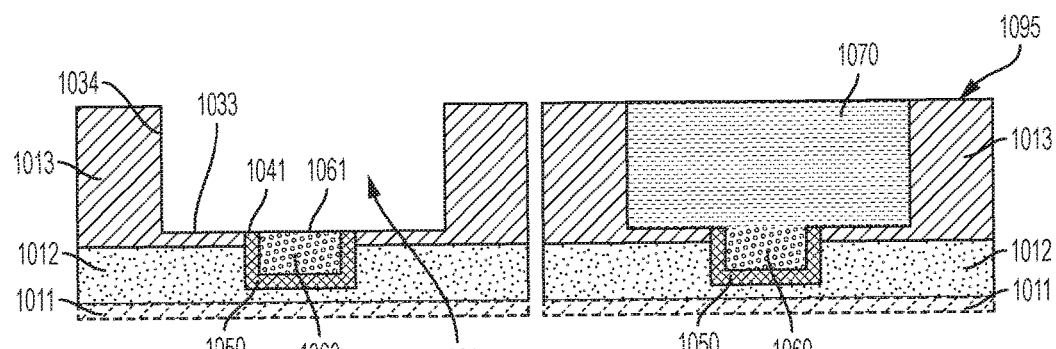

HYBRID DIELECTRIC SCHEME FOR VARYING LINER THICKNESS AND MANGANESE CONCENTRATION

BACKGROUND

The present invention relates to semiconductor devices and, more specifically, to a hybrid dielectric scheme that allows for varying liner thicknesses and manganese (Mn) concentrations between a back-end-of-line (BEOL) line and via interconnects.

As semiconductor device technology scales beyond the 10 nm node, it has been observed that increases in BEOL resistance-capacitance (RC) are occurring. These increases are in some cases causing BEOL parasitics to become a dominant factor in the degradation of product performance and various approaches for addressing this issue have been proposed. For example, a scaling down of a copper (Cu) barrier thickness has been attempted but is often found to be insufficient is avoiding the BEOL parasitics in addition to causing problems with reliability. Thus, the use of self-formed-barriers (SFB) has become a leading candidate for achieving metallization in semiconductor devices. However, because SFBs typically require high dopant (Mn) concentrations in Cu, the choice to employ SFBs can lead to an increase in an overall resistance in interconnects of the semiconductor devices.

SUMMARY

According to a non-limiting embodiment of the present invention, a semiconductor device is provided and includes first and second dielectrics, first and second conductive elements, a self-formed-barrier (SFB) and a liner. The first and second dielectrics are disposed with one of first-over-second dielectric layering and second-over-first dielectric layering. The first and second conductive elements are respectively suspended at least partially within a lower one of the first and second dielectrics and at least partially within the other one of the first and second dielectrics. The self-formed-barrier (SFB) is formed about a portion of one of the first and second conductive elements which is suspended in the second dielectric. The liner is deposited about a portion of the other one of the first and second conductive elements which is partially suspended in the first dielectric.

According to another non-limiting embodiment, a semiconductor device is provided. The semiconductor device includes a semiconductor substrate, porous and dense dielectrics, a via, an interconnect line, a manganese-based self-formed-barrier (SFB) and a liner. The porous and dense dielectrics are disposed on the semiconductor substrate with one of porous-over-dense dielectric layering and dense-over-porous dielectric layering. The via is suspended at least partially within a lower one of the porous and dense dielectrics. The interconnect line is suspended at least partially within the other one of the porous and dense dielectrics. The manganese-based SFB is formed about a portion of one of the via and the interconnect line which is suspended in the dense dielectric. The liner is deposited about a portion of the other one of the via and the interconnect line which is partially suspended in the porous dielectric.

According to yet another non-limiting embodiment, a method of fabricating a semiconductor device is provided. The method includes disposing first and second dielectrics on a semiconductor substrate with one of first-over-second dielectric layering and second-over-first dielectric layering. The method further includes suspending a first conductive element at least partially within a lower one of the first and second dielectrics and suspending a second conductive element at least partially within the other one of the first and second dielectrics. In addition, the method includes forming a self-formed-barrier (SFB) about a portion of one of the first and second conductive elements which is suspended in the second dielectric and depositing a liner about a portion of the other one of the first and second conductive elements which is partially suspended in the first dielectric.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-13 are provided to illustrate a hybrid dielectric scheme allowing for varying liner thicknesses and Mn concentrations between a BEOL line and via interconnects in which:

FIG. 1 is a side view of a hybrid dielectric structure in accordance with embodiments;

FIG. 2 is a side view of interconnect line and via etchings in the hybrid dielectric structure of FIG. 1;

FIG. 3 is a side view of a self-formed-barrier (SFB) and conductive material with a high Mn concentration deposited in the interconnect line and via etchings of FIG. 2;

FIG. 4 is a side view of an interconnect line etching in the SFB and the conductive material of FIG. 3;

FIG. 5 is a side view of a liner deposited along a perimeter of the interconnect line etching of FIG. 4;

FIG. 6 is a side view of conductive material with a low Mn concentration deposited in the interconnect line etching with the liner of FIG. 5;

FIG. 7 is a side view of a hybrid dielectric structure in accordance with embodiments;

FIG. 8 is a side view of interconnect line and via etchings in the hybrid dielectric structure of FIG. 7;

FIG. 9 is a side view of a liner deposited along a perimeter of the interconnect line and via etchings of FIG. 8;

FIG. 10 is a side view of conductive material with a low Mn concentration deposited in the interconnect and via line etchings with the liner of FIG. 9;

FIG. 11 is a side view of an interconnect line etching in the conductive material of FIG. 10;

FIG. 12 is a side view of conductive material with a high Mn concentration deposited in the interconnect line etching of FIG. 11; and FIG. 13 is a side view of an SFB formed from the conductive material with the high Mn concentration of FIG. 12.

DETAILED DESCRIPTION

Figure 13:
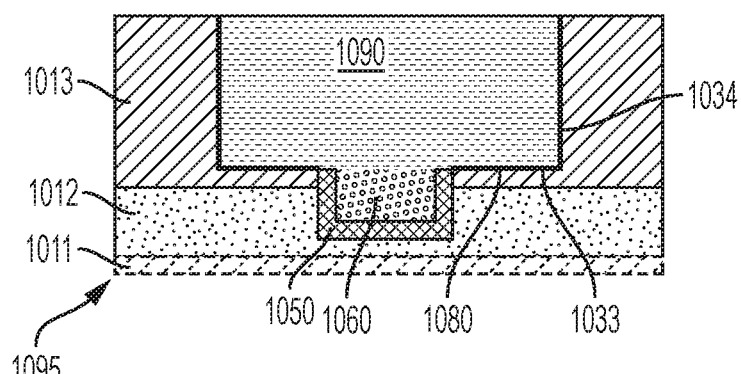

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of aspects of the present invention, one or more embodiments relate to fabrication of BEOL interconnects with hybrid dielectrics and variable liner thickness between interconnect lines and vias. An Mn-based self-formed-barrier (SFB) is allowed to form in either an interconnect line or a via, which is surrounded by a dense dielectric, in a given device. The other dielectric layer is porous (low-k) and allows for a reduction in resistance-capacitance (RC). An etch-k operation capable of removing liner and conductive material is executed in the porous dielectric and allowing it to be refilled with low-Mn concentration Cu.

With reference to FIG. 1, a hybrid dielectric structure 10 is provided. The hybrid dielectric structure 10 includes a semiconductor substrate 11, a dense (high-k) dielectric layer 12, which is disposed on an upper surface of the semiconductor substrate 11, and a porous (low-k) dielectric layer 13, which is disposed on an upper surface of the dense dielectric layer 12.

With reference to FIG. 2, an entirety of a via etching 20 is etched into the dense dielectric layer 12, a lower portion 210 of an interconnect line etching 21 is etched into the dense dielectric layer 12 and an upper portion 211 of the interconnect line etching 21 is etched into the porous dielectric layer 13. In accordance with embodiments, a height of the via etching 20 is less than a thickness of the dense dielectric layer 12. Thus, a bottom portion of the via etching 20 is separated from the upper surface of the semiconductor substrate 11 by a thin layer of the material of the dense dielectric layer 12 and an upper portion of the via etching 20 is recessed from a plane of the upper surface of the dense dielectric layer 12. By contrast, a height of the interconnect line etching 21 is greater than a thickness of the porous dielectric layer 13. Thus, while an upper portion of the interconnect line etching 21 can be coplanar with a plane of an upper surface of the porous dielectric layer 13, a lower portion of the interconnect line etching 21 extends below the plane of the upper surface of the dense dielectric layer 12 to the upper portion of the via etching 20. As such, because the interconnect line etching 21 has a greater lateral width as compared to the via etching 20, the interconnect line etching 21 and the via etching 20 cooperatively form a stepped formation 22 in the dense dielectric layer 12.

With reference to FIG. 3, conductive material 30 that is impregnated with a relatively high Mn concentration is filled or deposited in the via etching 20 and the interconnect line etching 21 (see FIG. 2). The conductive material 30 can include Cu or other similar materials and the relatively high Mn concentration can be an Mn concentration of about 5-10%. In some cases, the relatively high Mn concentration can be an Mn concentration of about 8%.

Once the conductive material 30 that is impregnated with the relatively high Mn concentration is deposited in the via etching 20 and the interconnect line etching 21, an anneal operation can be conducted to cause a formation of an SFB 31 (or a manganese-based SFB 31) as shown in FIG. 3. It is to be understood, however, that the anneal operation of FIG. 3 need not be conducted at this time and that the anneal operation could instead be conducted immediately before or immediately following the operations of FIG. 4 which will be described below. In any case, as a result of the anneal operation, the Mn impregnating the conductive material 30 is driven outwardly from the conductive material 30 to chemically interact with at least the material of the surrounding dense dielectric layer 12. Such interactions lead to the formation of the SFB 31 at least at the sidewalls 310 and the bottom surface 311 of the via etching 20 and leave the conductive material 30 in place. The conductive material 30 left in place consequently forms a conductive via element 40 that is disposed within the via etching 20 along with the SFB 31 at the sidewalls 310 and the bottom surface 311 of the via etching 20.

At this point, it is noted that as illustrated in FIG. 3, because the operations of FIG. 4 have not yet been executed, the impregnated conductive material 30 remains in the interconnect line etching 21 so that the SFB 31 is also formed on the bottom surface and the sidewalls of the interconnect line etching 21. In the alternative cases in which the anneal follows the operations of FIG. 4, the SFB 31 is only formed at the sidewalls 310 and the bottom surface 311 of the via etching 20.

With reference to FIG. 4, etch-k processing is executed to remove material from the interconnect line etching 21. The removed material can be the conductive material 30 that is left behind in those cases in which the above-noted anneal processing has already taken place or, in those cases in which the above-noted anneal processing has not yet occurred, a combination of the SFB 31 that is formed on the bottom surface and the sidewalls of the interconnect line etching 21 and the conductive material 30 that is impregnated with the relatively high Mn concentration. The etch-k processing can be selective to the respective materials of the dense dielectric layer 12 and the porous dielectric layer 13 so that no portion of what remains of the dense dielectric layer 12 and so that no portion of the porous dielectric layer 13 are removed.

As a result of the etch-k processing, the interconnect line etching 21 is emptied and delimited by an upper surface 401 of the conductive via element 40, an exposed upwardly facing surface 402 of the dense dielectric layer 12, exposed inwardly facing short sidewalls 403 of the dense dielectric layer 12 and exposed inwardly facing sidewalls 404 of the porous dielectric layer 13. The upper surface 401 and the exposed upwardly facing surface 402 are substantially coplanar while the exposed inwardly facing short sidewalls 403 and the exposed inwardly facing sidewalls 404 are similarly substantially aligned.

With reference to FIG. 5, a liner 50 is deposited along the perimeter of the interconnect line etching 21 and therefore extends along the upper surface 401, the exposed upwardly facing surface 402, the exposed inwardly facing short sidewalls 403 and the exposed inwardly facing sidewalls 404 (see FIG. 4). The liner 50 is thicker than the SFB 31 and can include nitrides, such as tantalum nitride (TaN), or oxides.

With reference to FIG. 6, the remaining space within the interconnect line etching 21 is filled with conductive material 60 that is impregnated with a relatively low Mn concentration. The conductive material 60 can include Cu or other similar materials and the relatively low Mn concentration can be an Mn concentration of about 0-1%. In some cases, the relatively low Mn concentration can be an Mn concentration of about 0.5%. In any case, the conductive material 60 serves to form a conductive interconnect line 70.

Thus, as shown in FIG. 6, a semiconductor device 80 is provided. The semiconductor device 80 includes the semiconductor substrate 11, the dense dielectric layer 12 and the porous dielectric layer 13 being disposed on the semiconductor substrate 11 with a porous-over-dense dielectric layering, the conductive via element 40 and the conductive interconnect line 70. The conductive via element 40 is entirely suspended within the dense dielectric layer 12 and the conductive interconnect line 70 is partially suspended within the porous dielectric layer 13. The semiconductor device 80 further includes the manganese-based SFB 31 that is formed about the portion of the conductive via element 40 and the liner 50, which is deposited about the portion of the conductive interconnect line 70.

With reference to FIG. 7, a hybrid dielectric structure 1010 is provided. The hybrid dielectric structure 1010 includes a semiconductor substrate 1011, a porous (low-k) dielectric layer 1012, which is disposed on an upper surface of the semiconductor substrate 1011, and a dense (high-k) dielectric layer 1013, which is disposed on an upper surface of the porous dielectric layer 1012.

With reference to FIG. 8, a lower portion 10200 of a via etching 1020 is etched into the porous dielectric layer 1012, an upper portion 10201 of the via etching 1020 is etched into the dense dielectric layer 1013 and an entirety of an interconnect line etching 1021 is etched into the dense dielectric layer 1013. In accordance with embodiments, a height of the interconnect line etching 1021 is less than a thickness of the dense dielectric layer 1013. Thus, while a bottom portion of the via etching 1020 is separated from the upper surface of the semiconductor substrate 1011 by a thin layer of the material of the porous dielectric layer 1012 and the upper portion 10201 of the via etching 1020 protrudes above a plane of the upper surface of the porous dielectric layer 1012, a lower portion of the interconnect line etching 1021 extends above the plane of the upper surface of the porous dielectric layer 1012 to the upper portion of the via etching 1020. As such, because the interconnect line etching 1021 has a greater lateral width as compared to the via etching 1020, the interconnect line etching 1021 and the via etching 1020 cooperatively form a stepped formation 1022 in the dense dielectric layer 1013.

As a result of the etch processing, the via etching 1020 and the interconnect line etching 1021 are both emptied. The via etching 1020 is delimited by an exposed upwardly facing surface 1030 of the porous dielectric layer 1012, exposed inwardly facing sidewalls 1031 of the porous dielectric layer 1012, exposed inwardly facing short sidewalls 1032 of the dense dielectric layer 1013, an exposed upwardly facing surface 1033 of the dense dielectric layer 1013 and exposed inwardly facing sidewalls 1034 of the dense dielectric layer 1013. The exposed inwardly facing sidewalls 1031 of the porous dielectric layer 1012 and the exposed inwardly facing short sidewalls 1032 of the dense dielectric layer 1013 are substantially aligned.

With reference to FIG. 9, a liner 1040 is deposited along the respective perimeters of the via etching 1020 and the interconnect line etching 1021. The liner 1040 therefore extends along the exposed upwardly facing surface 1030, the exposed inwardly facing sidewalls 1031, the exposed inwardly facing short sidewalls 1032, the exposed upwardly facing surface 1033 and the exposed inwardly facing sidewalls 1034 (see FIG. 8). The liner 1040 can include nitrides, such as tantalum nitride (TaN), or oxides.

With reference to FIG. 10, the remaining space within the via etching 1020 and the interconnect line etching 1021 is filled with conductive material 1050 that is impregnated with a relatively low Mn concentration. The conductive material 1050 can include Cu or other similar materials and the relatively low Mn concentration can be an Mn concentration of about 0-1%. In some cases, the relatively low Mn concentration can be an Mn concentration of about 0.5%. In any case, the conductive material 1050 that fills the remaining space in the via etching 1020 serves to form at least a conductive via element 1060.

With reference to FIG. 11, etch-k processing is executed to remove the material of the liner 1040 and the conductive material 1050 from the interconnect line etching 1021. The etch-k processing can be selective to the respective materials of the porous dielectric layer 1012 and the dense dielectric layer 1013 so that no portion of the porous dielectric layer 1012 and so that no portion of what remains of the dense dielectric layer 1013 are removed.

As a result of the etch-k processing, the interconnect line etching 1021 is emptied and delimited by an upper surface 1061 of the conductive via element 1060 and an upper surface 1041 of the liner 1040 as well as the exposed upwardly facing surface 1033 and the exposed inwardly facing sidewalls 1034 of the dense dielectric layer 1013. The upper surface 1061, the upper surface 1041 and the exposed upwardly facing surface 1033 are substantially coplanar.

With reference to FIG. 12, conductive material 1070 that is impregnated with a relatively high Mn concentration is filled or deposited in the interconnect line etching 1021. The conductive material 1070 can include Cu or other similar materials and the relatively high Mn concentration can be an Mn concentration of about 5-10%. In some cases, the relatively high Mn concentration can be an Mn concentration of about 8%.

With reference to FIG. 13, once the conductive material 1070 that is impregnated with the relatively high Mn concentration is deposited in the interconnect line etching 1021, an anneal operation is conducted to cause a formation of an SFB 1080 (or a manganese-based SFB 1080) as the Mn impregnating the conductive material 1070 is driven outwardly from the conductive material 1070 to chemically interact with at least the material of the surrounding dense dielectric layer 1013. Such interactions lead to the formation of the SFB 1080 at the exposed upwardly facing surface 1033 and the exposed inwardly facing sidewalls 1034 of the dense dielectric layer 1013. The conductive material 1080 left in place consequently forms a conductive interconnect line 1090 that is disposed within the interconnect line etching 1021 along with the SFB 1080.

Thus, as shown in FIG. 13, a semiconductor device 1095 is provided. The semiconductor device 1090 includes the semiconductor substrate 1011, the porous dielectric layer 1012 and the dense dielectric layer 1013 being disposed on the semiconductor substrate 1011 with a dense-over-porous dielectric layering, the conductive via element 1060 and the conductive interconnect line 1090. The conductive via element 1060 is partially suspended within the porous dielectric layer 1012 and the conductive interconnect line 1090 is entirely suspended within the dense dielectric layer 1013. The semiconductor device 1095 further includes the manganese-based SFB 1080 that is formed about the portion of the conductive interconnect line 1090 and the liner 1040, which is deposited about the portion of the conductive via element 1060.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   first and second dielectrics disposed with first-over-second dielectric layering;
   first and second conductive elements respectively suspended at least partially within the second dielectrics and at least partially within the first dielectric;
   a self-formed-barrier (SFB) formed about a portion of the first conductive element; and
   a liner deposited about a portion of the second conductive element,
   wherein:
   the portion of the first conductive element about which the SFB is formed is suspended entirely within the second dielectric and the portion of the second conductive element about which the liner is deposited is suspended partially within the first dielectric, and
   the SFB is formed from a first concentration of manganese (MN) in the first conductive element, the liner is relatively thick as compared to the SFB and the second conductive element has a second concentration of Mn, which is lower than the first concentration.

2. The semiconductor device according to claim 1 further comprising a substrate on which the first and second dielectrics are disposed.

3. The semiconductor device according to claim 1, wherein:
   the first and second dielectrics respectively comprise porous and dense dielectrics, and
   the first and second conductive elements respectively comprise a via and an interconnect line.

4. The semiconductor device according to claim 3, wherein the SFB comprises manganese (MN).

5. A semiconductor device comprising:
   a semiconductor substrate;
   porous and dense dielectrics disposed on the semiconductor substrate with porous-over-dense dielectric layering;
   a via suspended at least partially within the dense dielectric;
   an interconnect line suspended at least partially within the porous dielectric;
   a manganese-based self-formed-barrier (SFB) formed about a portion of the via; and
   a liner deposited about a portion of the interconnect line,
   wherein:
   the portion of the via about which the manganese-based SFB is formed is suspended entirely within the dense dielectric and the portion of the interconnect about which the liner is deposited is suspended partially within the porous dielectric, and
   the manganese-based SFB is formed from a first concentration of manganese (MN) in the via conductive element, the liner is relatively thick as compared to the manganese-based SFB and the interconnect line has a second concentration of Mn, which is lower than the first concentration.

\* \* \* \* \*